(12) United States Patent
Manssen et al.

(10) Patent No.: US 11,444,593 B2
(45) Date of Patent: Sep. 13, 2022

(54) METHOD AND APPARATUS FOR ADAPTING A VARIABLE IMPEDANCE NETWORK

(71) Applicant: NXP USA, Inc., Austin, TX (US)

(72) Inventors: Keith Manssen, Austin, TX (US); Matthew Russell Greene, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/171,739

(22) Filed: Feb. 9, 2021

(65) Prior Publication Data

US 2021/0167747 A1     Jun. 3, 2021

Related U.S. Application Data

(60) Continuation of application No. 16/841,266, filed on Apr. 6, 2020, now Pat. No. 10,958,234, which is a division of application No. 16/295,657, filed on Mar. 7, 2019, now Pat. No. 10,615,769, which is a division of application No. 15/673,613, filed on Aug. 10, 2017, now Pat. No. 10,263,595, which is a continuation of application No. 15/367,753, filed on Dec. 2, 2016, now Pat. No. 9,742,375, which is a continuation of application No. 14/332,458, filed on Jul. 16, 2014, now Pat. No. 9,548,716, which is a continuation of application No. 12/729,221, filed on Mar. 22, 2010, now Pat. No. 8,803,631.

(51) Int. Cl.
*H03H 7/38* (2006.01)
*H03H 7/40* (2006.01)
*H03H 5/12* (2006.01)
*H03H 7/00* (2006.01)
*H03K 17/56* (2006.01)

(52) U.S. Cl.
CPC ............... *H03H 7/38* (2013.01); *H03H 5/12* (2013.01); *H03H 7/004* (2013.01); *H03H 7/40* (2013.01); *H03K 17/56* (2013.01)

(58) Field of Classification Search
CPC ............ H03H 7/38; H03H 7/40; H03H 7/004; H03H 7/46; H03H 7/461; H03H 7/463; H03H 7/465; H03H 7/466; H03H 7/468; H03H 5/12; H03K 17/56
See application file for complete search history.

(56) References Cited

U.S. PATENT DOCUMENTS

| | | |
|---|---|---|
| 6,747,522 B2 | 6/2004 | Pietruszynski et al. |
| 6,906,653 B2 | 6/2005 | Uno |
| 7,299,018 B2 | 11/2007 | Van Rumpt |

(Continued)

FOREIGN PATENT DOCUMENTS

WO     2009/108391 A1     9/2009

*Primary Examiner* — Stephen E. Jones

(57) ABSTRACT

The present disclosure may include, for example, a tunable capacitor having a decoder for generating a plurality of control signals, and an array of tunable switched capacitors comprising a plurality of fixed capacitors coupled to a plurality of switches. The plurality of switches can be controlled by the plurality of control signals to manage a tunable range of reactance of the array of tunable switched capacitors. Additionally, the array of tunable switched capacitors is adapted to have non-uniform quality (Q) factors. Additional embodiments are disclosed.

20 Claims, 9 Drawing Sheets

(56) References Cited

U.S. PATENT DOCUMENTS

| | | |
|---|---|---|
| 8,803,631 B2 | 8/2014 | Greene et al. |
| 9,548,716 B2 | 1/2017 | Manssen et al. |
| 9,742,375 B2 | 8/2017 | Manssen et al. |
| 10,263,595 B2 | 4/2019 | Manssen et al. |
| 2005/0093645 A1* | 5/2005 | Watanabe ............ H03H 7/383 |
| | | 333/101 |
| 2006/0077082 A1 | 4/2006 | Shanks et al. |
| 2012/0286586 A1 | 11/2012 | Balm |
| 2019/0207580 A1 | 7/2019 | Manssen |

* cited by examiner

Reduce size of S5 to make Q only good in low band since circuits usually need less capacitance in high band.

Allows substrate to not connect to $S_5/C_5$ in order to reduce off capacitance

Uses external high Q cap to allow the switch to be smaller and still maintain the Q of the total Cap

TABLE 1

| Switch activation matrix | Capacitance in Binary Array | | | | |
|---|---|---|---|---|---|
| | #1 | #2 | #3 | #4 | |
| Binary Control Word | 2 pF | 1 pF | 0.5 pF | 0.25 pF | Total Capacitance |
| 15 | 1 | 1 | 1 | 1 | 3.75 |
| 14 | 1 | 1 | 1 | 0 | 3.5 |
| 13 | 1 | 1 | 0 | 1 | 3.25 |
| 12 | 1 | 1 | 0 | 0 | 3 |
| 11 | 1 | 0 | 1 | 1 | 2.75 |
| 10 | 1 | 0 | 1 | 0 | 2.5 |
| 9 | 1 | 0 | 0 | 1 | 2.25 |
| 8 | 1 | 0 | 0 | 0 | 2 |
| 7 | 0 | 1 | 1 | 1 | 1.75 |
| 6 | 0 | 1 | 1 | 0 | 1.5 |
| 5 | 0 | 1 | 0 | 1 | 1.25 |
| 4 | 0 | 1 | 0 | 0 | 1 |
| 3 | 0 | 0 | 1 | 1 | 0.75 |
| 2 | 0 | 0 | 1 | 0 | 0.5 |
| 1 | 0 | 0 | 0 | 1 | 0.25 |
| 0 | 0 | 0 | 0 | 0 | 0 |

FIG. 21

TABLE 2

| Switch activation matrix | Capacitance in Non-binary Array | | | | | |
|---|---|---|---|---|---|---|
| | #1 | #2 | #3 | #4 | #5 | |
| Binary Control Word | 1 pF | 1 pF | 1 pF | 0.5 pF | 0.25 pF | Total Capacitance |
| 15 | 1 | 1 | 1 | 1 | 1 | 3.75 |
| 14 | 1 | 1 | 1 | 1 | 0 | 3.5 |
| 13 | 1 | 1 | 1 | 0 | 1 | 3.25 |
| 12 | 1 | 1 | 1 | 0 | 0 | 3 |
| 11 | 0 | 1 | 1 | 1 | 1 | 2.75 |
| 10 | 0 | 1 | 1 | 1 | 0 | 2.5 |
| 9 | 0 | 1 | 1 | 0 | 1 | 2.25 |
| 8 | 0 | 1 | 1 | 0 | 0 | 2 |
| 7 | 0 | 0 | 1 | 1 | 1 | 1.75 |
| 6 | 0 | 0 | 1 | 1 | 0 | 1.5 |
| 5 | 0 | 0 | 1 | 0 | 1 | 1.25 |
| 4 | 0 | 0 | 1 | 0 | 0 | 1 |
| 3 | 0 | 0 | 0 | 1 | 1 | 0.75 |
| 2 | 0 | 0 | 0 | 1 | 0 | 0.5 |
| 1 | 0 | 0 | 0 | 0 | 1 | 0.25 |
| 0 | 0 | 0 | 0 | 0 | 0 | 0 |

FIG. 22

METHOD AND APPARATUS FOR ADAPTING A VARIABLE IMPEDANCE NETWORK

CROSS-REFERENCE TO RELATED APPLICATIONS

This application is a continuation of U.S. application Ser. No. 16/841,266, filed Apr. 6, 2020, which is a divisional of U.S. application Ser. No. 16/295,657, filed Mar. 7, 2019 (now U.S. Pat. No. 10,615,769), which is a divisional of U.S. application Ser. No. 15/673,613, filed Aug. 10, 2017 (now U.S. Pat. No. 10,263,595), which is a continuation of U.S. application Ser. No. 15/367,753, filed Dec. 2, 2016 (now U.S. Pat. No. 9,742,375), which is a continuation of U.S. application Ser. No. 14/332,458, filed Jul. 16, 2014 (now U.S. Pat. No. 9,548,716), which is a continuation of U.S. application Ser. No. 12/729,221, filed Mar. 22, 2010 (now U.S. Pat. No. 8,803,631), which are incorporated herein by reference in their entirety.

FIELD OF THE DISCLOSURE

The present disclosure relates to variable impedance networks and more specifically to a method and apparatus for adapting a variable impedance network.

BACKGROUND

Existing multi-frequency wireless devices (e.g., radios) use an antenna structure that attempts to radiate at optimum efficiency over the entire frequency range of operation, but can really only do so over a subset of the frequencies. Due to size constraints, and aesthetic design reasons, an antenna designer may be forced to compromise the performance in some of the frequency bands. An example of such a wireless device could be a mobile telephone that operates over a range of different frequencies, such as 800 MHz to 2200 MHz. The antenna will not radiate efficiently at all frequencies due to the nature of the design, and the power transfer between the antenna, the power amplifier, and the receiver in the radio can vary a considerable amount.

Additionally, an antenna's performance can be impacted by its operating environment. For example, multiple use cases exist for radio handsets, which include such conditions as the placement of the handset's antenna next to a user's head, in the user's pocket, the covering of an antenna with a hand, a pull-out antenna in the up position or down position, a flip phone with the lid open versus closed, hands-free operation with a Bluetooth headset or speakerphone feature, or other operational possibilities, all of which can affect the wireless device antenna's radiated efficiency.

Many existing radios use a simple circuit composed of fixed value components that are aimed at improving the power transfer from power amplifier to antenna, or from the antenna to the receiver, but since the components used are fixed in value there is typically a compromise when attempting to cover multiple frequency bands and multiple use cases.

Prior art systems have attempted to solve this problem by employing a variety of tunable elements in the radio frequency path, thus attempting to compensate for changing antenna performance. Typically, prior art system arrange these adjustable elements into single device substrates or semiconductor die, both to re-use control and bias circuitry between several tunable capacitors on the same die and to reduce the number of input/output connection pads necessary to connect the devices to external circuitry.

BRIEF DESCRIPTION OF THE DRAWINGS

FIG. 21 shows TABLE 1 which depicts an illustrative embodiment of a table with digital logic for controlling of a binary-switched capacitor array; and FIG. 22 shows TABLE 2 which depicts an illustrative embodiment of a table with digital logic for controlling a non-binary-switched capacitor array.

DETAILED DESCRIPTION

An embodiment of the present disclosure can entail a tunable capacitor having a decoder for generating a plurality of control signals, and an array of tunable switched capacitors comprising a plurality of fixed capacitors coupled to a plurality of switches. The plurality of switches can be controlled by the plurality of control signals to manage a tunable range of reactance of the array of tunable switched capacitors. Additionally, the array of tunable switched capacitors is adapted to have non-uniform quality (Q) factors.

An embodiment of the present disclosure can entail a variable matching network having a plurality of tunable capacitors contained on a single substrate. The single substrate can have a plurality of ports coupled to portions of the plurality of tunable capacitors. Additionally, the variable matching network can be configurable in a plurality of topologies by way of the plurality of ports.

An embodiment of the present disclosure can entail a device having first and second variable capacitors within a single substrate with each end of said first and second variable capacitors having an accessible external port, wherein the first and second variable capacitors are adapted to be configured as a Tee, Pi or L circuit topology.

An embodiment of the present disclosure can entail a method for causing an array of tunable switched capacitors to adapt to a variable load impedance, wherein the array of tunable switched capacitors is configured to have non-uniform Q factors.

An embodiment of the present disclosure can entail a tunable capacitor on a die having a decoder for generating a plurality of control signals, and an array of tunable switched capacitors including a plurality of fixed capacitors coupled to a plurality of switches. The plurality of switches can be controlled by the plurality of control signals to manage a tunable range of reactance of the array of tunable switched capacitors. One of the plurality of fixed capacitors can be optionally coupled to the array to reduce an aggregate parasitic capacitance of the array of tunable switched capacitors. The array of tunable switched capacitors can be adapted to have uniform quality (Q) factors.

Figure 1:
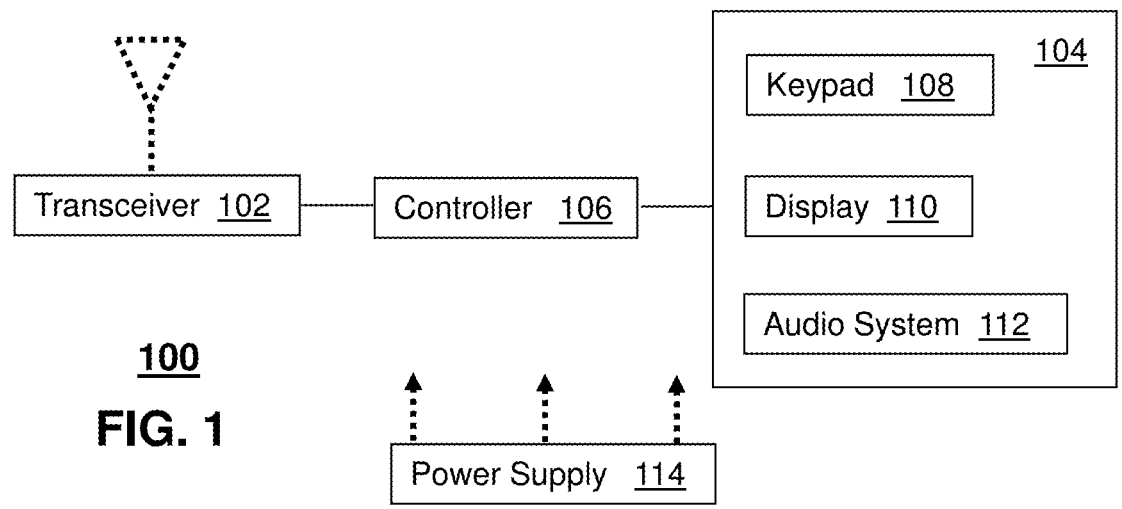
FIG. 1 depicts an illustrative embodiment of a communication device.

FIG. 1 depicts an exemplary embodiment of a communication device 100. The communication device 100 can comprise a wireless transceiver 102 (herein having independent transmit and receiver sections, a user interface (UI) 104, a power supply 114, and a controller 106 for managing operations thereof. The wireless transceiver 102 can utilize short-range or long-range wireless access technologies such as Bluetooth, WiFi, Digital Enhanced Cordless Telecommunications (DECT), or cellular communication technologies, just to mention a few. Cellular technologies can include, for example, CDMA-1X, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such a Flash, ROM, RAM, SRAM, DRAM or other like technologies.

Figure 2:
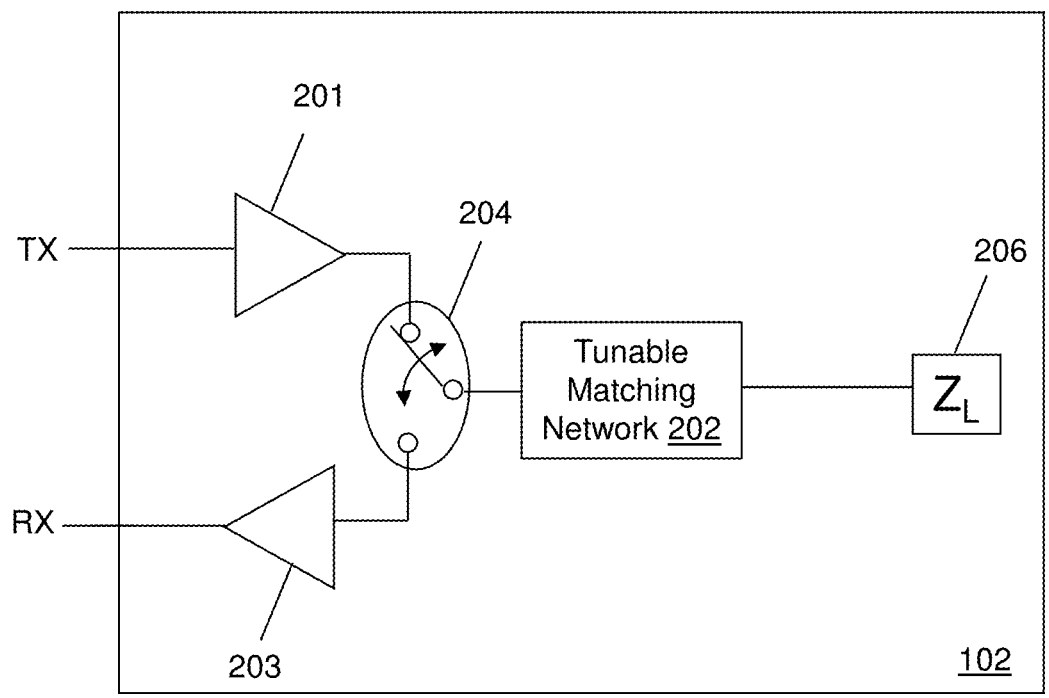
FIG. 2 depicts an illustrative embodiment of a portion of a transceiver of the communication device of FIG. 1.

FIG. 2 depicts an illustrative embodiment of a portion of the wireless transceiver 102 of the communication device 100 of FIG. 1. In GSM applications, the transmit and receive portions of the transceiver 102 can include common amplifiers 201, 203 coupled to a tunable matching network 202 and an impedance load 206 by way of a switch 204. The load 206 in the present illustration can an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA. These undisclosed configurations are contemplated by the present disclosure.

Figure 3:
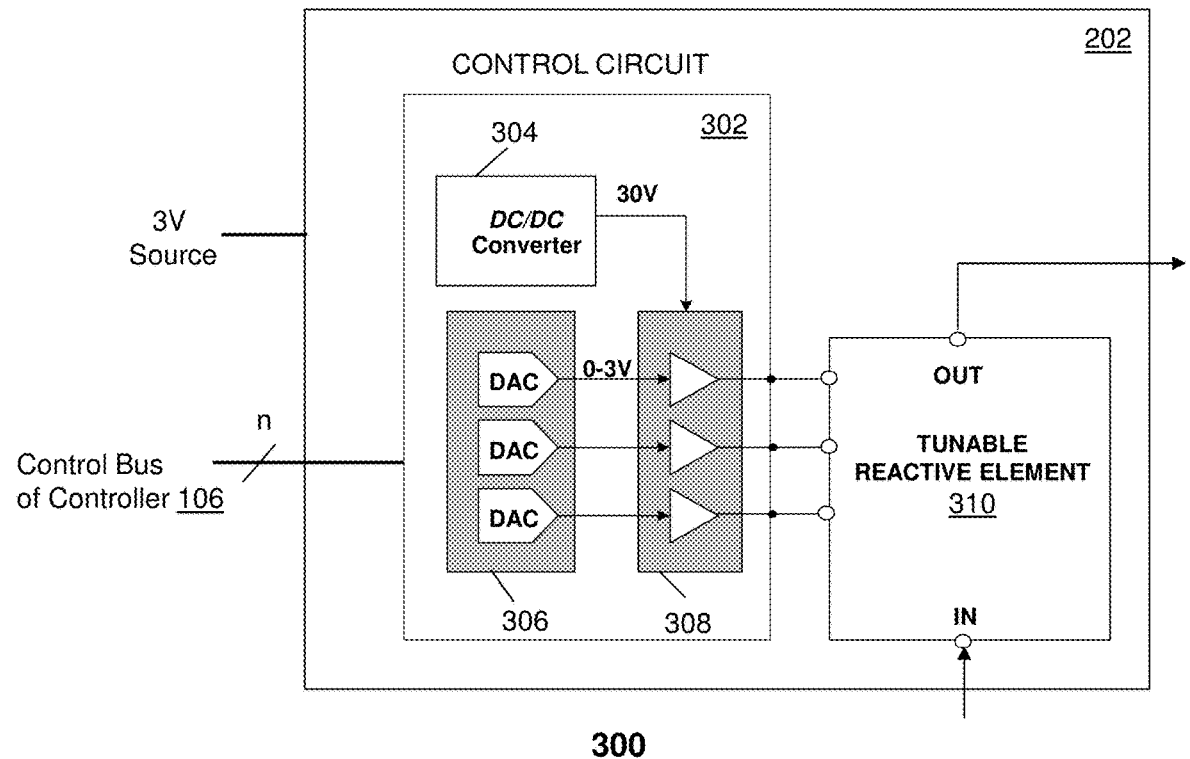
FIGS. 3-4 depict illustrative embodiments of a tunable matching network of the transceiver of FIG. 2.
Figure 4:
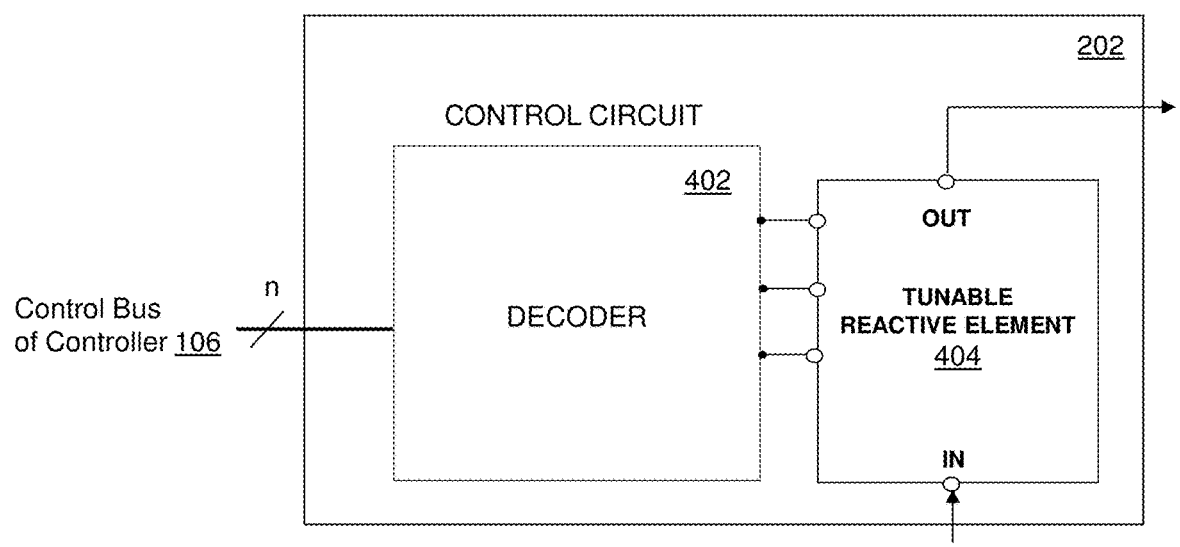
Figure 5:
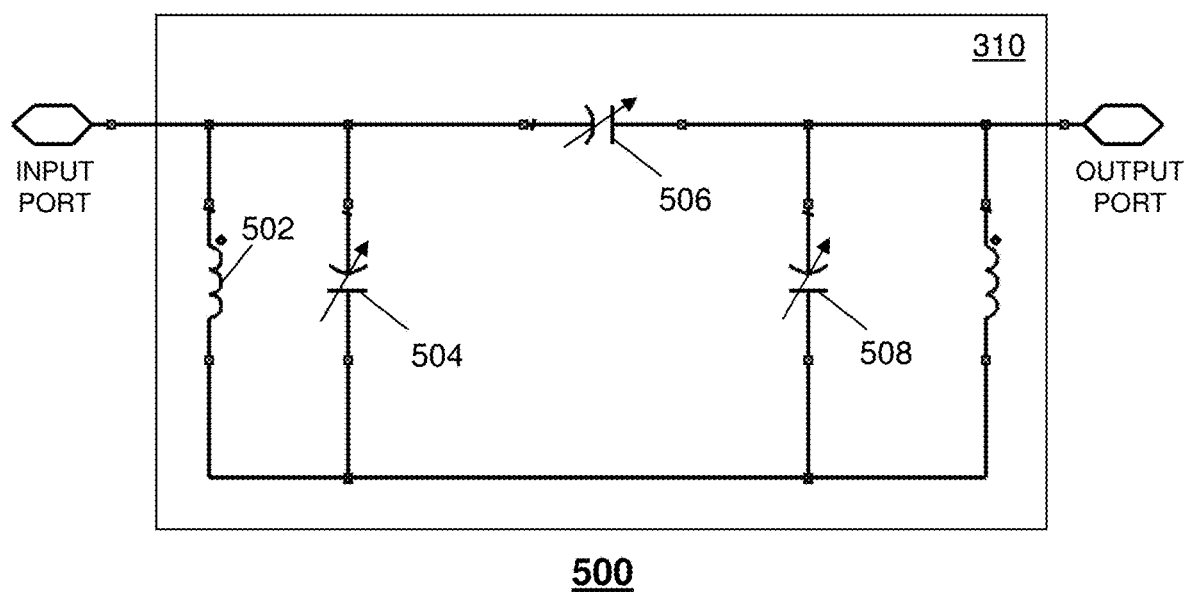
FIGS. 5-6 depict illustrative embodiments of a tunable reactive element of the tunable matching network.

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 504, 506 and 508 such as shown in FIG. 5, which depicts a possible circuit configuration for the tunable reactive element 310. In this illustration, the tunable reactive element 310 includes three tunable capacitors 504-508 and an inductor 502 with a fixed inductance. Other circuit configurations are possible, and thereby contemplated by the present disclosure.

The tunable capacitors 504-508 can each utilize technology that enables tunability of the capacitance of said component. One embodiment of the tunable capacitors 504-508 can utilize voltage or current tunable dielectric materials such as a composition of barium strontium titanate (BST). An illustration of a BST composition is the Parascan® Tunable Capacitor. In another embodiment, the tunable reactive element 310 can utilize semiconductor varactors. Other present or next generation methods or material compositions that can support a means for a voltage or current tunable reactive element are contemplated by the present disclosure.

The DC-to-DC converter 304 can receive a power signal such as 3 Volts from the power supply 114 of the communication device 100 in FIG. 1. The DC-to-DC converter 304 can use common technology to amplify this power signal to a higher range (e.g., 30 Volts) such as shown. The controller 106 can supply digital signals to each of the DACs 306 by way of a control bus of "n" or more wires to individually control the capacitance of tunable capacitors 504-508, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in FIG. 3 or the switches of the tunable reactive element 404 of FIG. 4. The control circuit 302 of FIG. 3 can utilize common digital logic to implement the SPI bus and to direct digital signals supplied by the controller 106 to the DACs.

Figure 6:
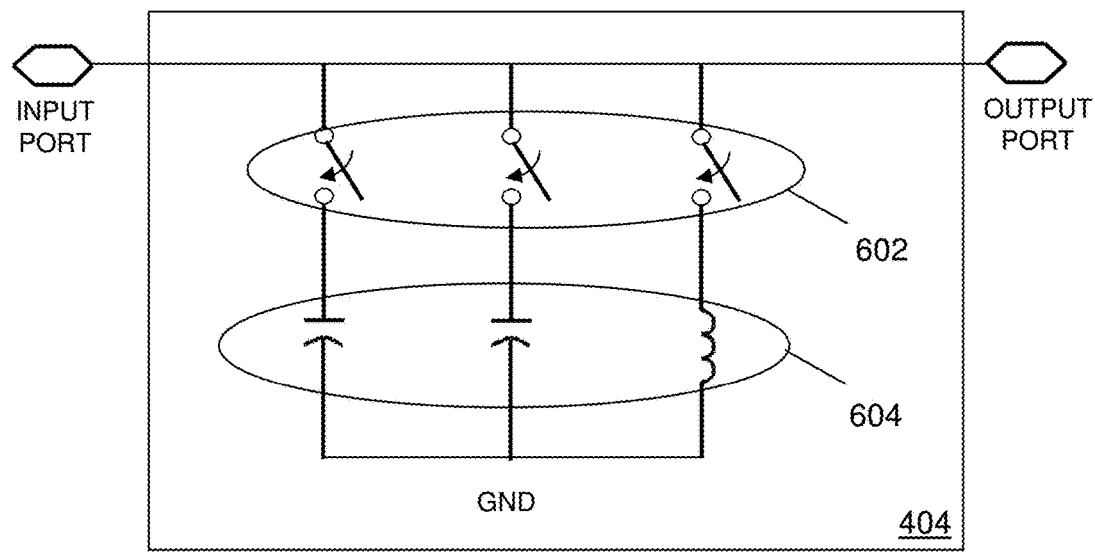

In another embodiment, the tunable matching network 202 can comprise a control circuit 402 in the form of a decoder and a tunable reactive element 404 comprising switchable reactive elements such as shown in FIG. 6. In this embodiment, the controller 106 can supply the control circuit 402 signals via the SPI bus which can be decoded with common Boolean or state machine logic to individually enable or disable the switching elements 602. The switching elements 602 can be implemented with semiconductor switches or micro-machined switches such as utilized in micro-electromechanical systems (MEMS). By independently enabling and disabling the reactive elements 604 (capacitor or inductor) of FIG. 6 with the switching elements 602, the collective reactance of the tunable reactive element 404 can be varied.

The tunability of the tunable matching networks 202, 204 provides the controller 106 a means to optimize performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so on. To achieve one or more desirable performance characteristics which can be defined, the communication device 100 utilizes a tuning state selection method as depicted in FIG. 7.

Figure 7:
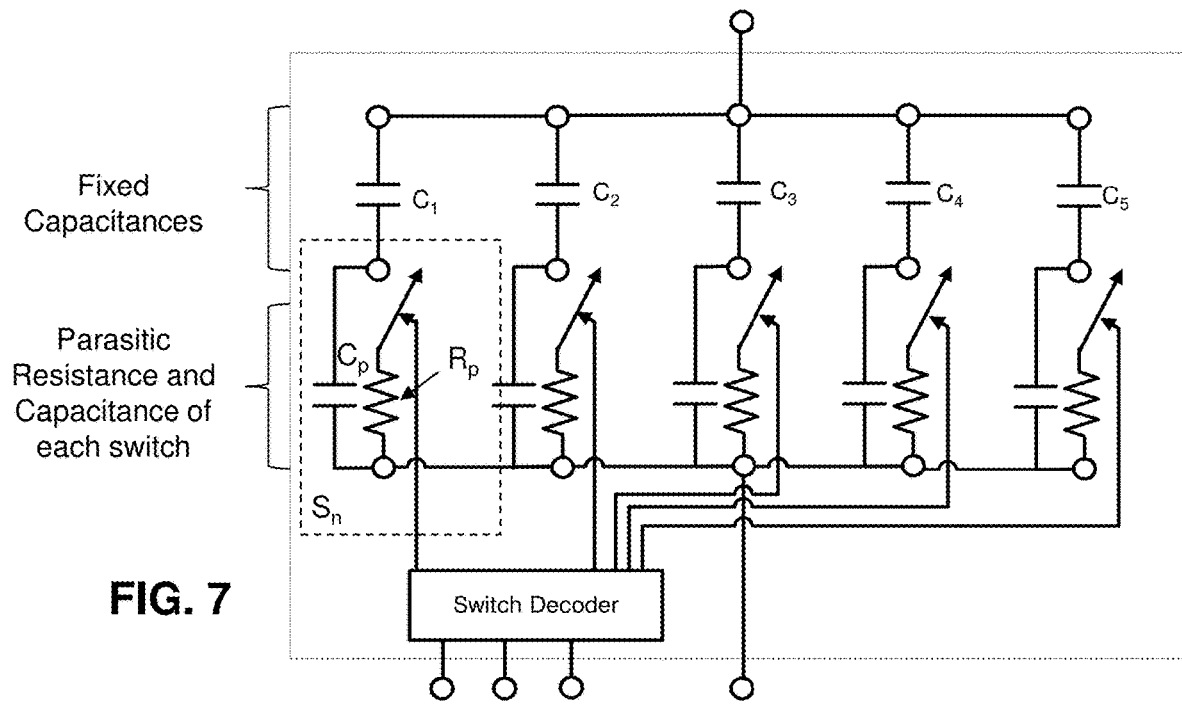
FIG. 7 depicts an illustrative embodiment of a switched variable capacitor array controlled by a switch decoder.

FIG. 7 depicts an illustrative embodiment of a switched variable capacitor array controlled by a switch decoder. The switched variable capacitor array can collectively represent one variable capacitor having a tuning range of operation which depends on the switching logic used to add and remove the fixed capacitors ($C_1$-$C_5$) shown in the top portion. Each of the fixed capacitors $C_1$-$C_5$ can be removed or applied to the array by a semiconductor (or MEMS) switch ($S_1$) controlled by a switch decoder that utilizes common Boolean and/or state machine logic to enable or disable the switches according to a predetermined tuning range. Each switch ($S_1$) has parasitic on-resistance and off-capacitance that can be controlled by an integrated circuit designer by the channel size of the switch and by the number of parallel and/or series semiconductor (or MEMS) switches used. The structure and size of each switch ($S_1$) determines the magnitude of these parasitics and the affect it has on the operating characteristics of the switched variable capacitor array as will be discussed shortly. For ease of discussion, references may be made to FIG. 8 which depicts an illustrative embodiment of a simplified diagram of the switched variable capacitor array of FIG. 7 without the switch decoder.

Figure 8:
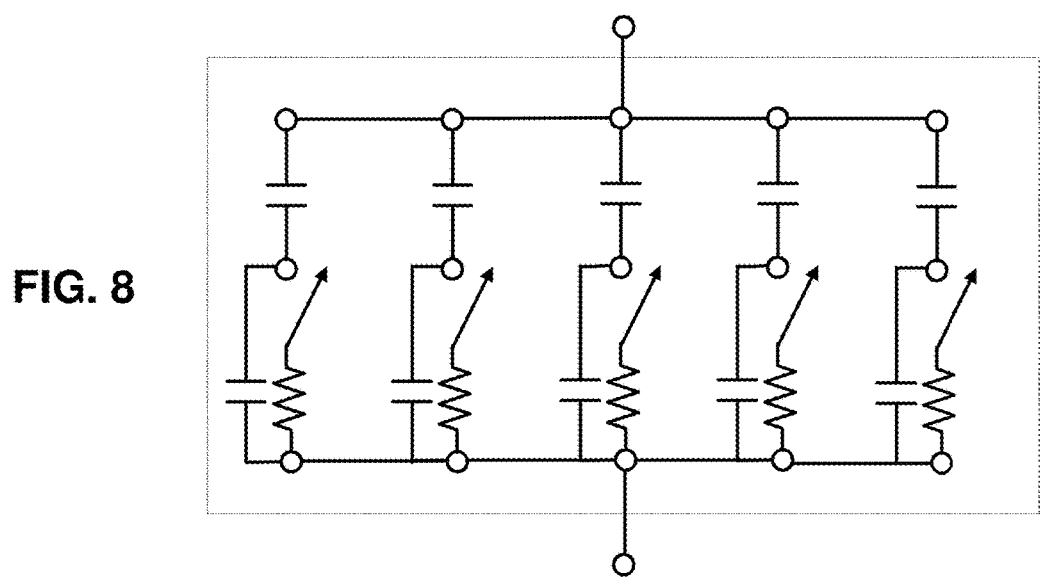
FIG. 8 depicts an illustrative embodiment of a simplified diagram of the switched variable capacitor array of FIG. 7.
Figure 9:
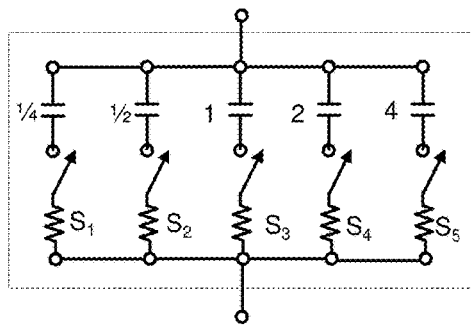
FIGS. 9-11 depict illustrative embodiments for improving a switched variable capacitor array.
Figure 10:
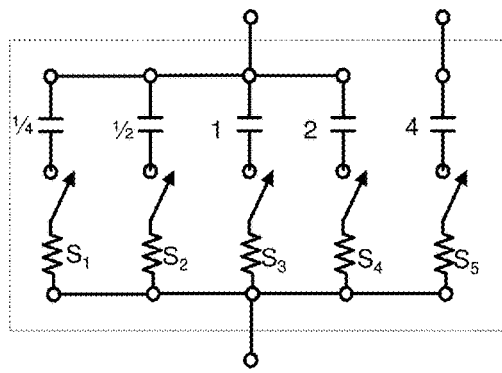
Figure 11:
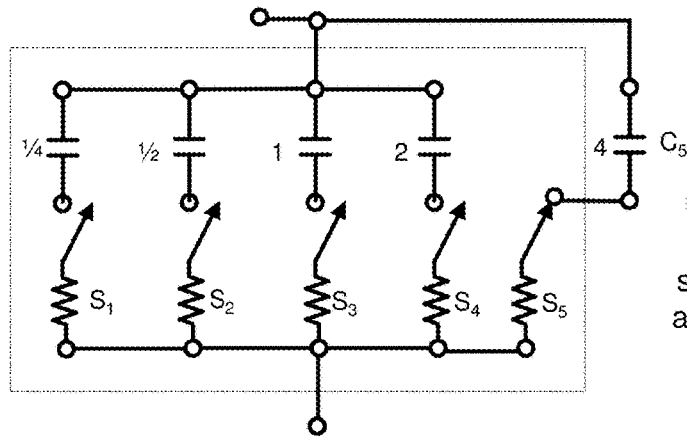

FIGS. 9-11 depict illustrative embodiments for improving the switched variable capacitor array of FIG. 8. Note that although FIGS. 9-11 do not show the parasitic capacitance depicted in FIGS. 7-8, such capacitance is inherently present in switches $S_1$-$S_5$, but not shown to simplify the illustration in these figures.

One embodiment of the present disclosure can entail changing the configuration and connections of the binary array of switchable capacitors such that some portions of the array, typically the largest capacitor in the array ($C_5$), can be left unconnected from the substrate if the larger value is not required by a specific tunable matching network for a specific application. For instance a typical switchable capacitor binary array can have the following values in the array: ¼ pF, ½ pF, 1 pF, 2 pF and 4 pF (shown in FIGS. 9-11). This array can theoretically be tunable between 0 pF and 7¾ pF by either connecting or disconnecting none, some or all of the capacitors in the array to the tunable matching network. However, there are practical limitations to the minimum capacitance which can be achieved in the actual fabrication of such a binary array.

Specifically, the switches themselves can have a certain amount of parasitic off-capacitance as shown in FIG. 8 which is present when the switch is in the "open" configuration, thus this parasitic capacitance limits the minimum capacitance value of the array to a value larger than zero. It is common for each individual capacitor-switch combination (e.g., $C_1$-$S_1$) shown in FIGS. 9-11 to have parasitic resistance and capacitance ($C_p$, $R_p$) shown in the switch combination $S_n$ of FIG. 7. As the switches are made larger, which is necessary as the switched capacitance gets larger (to maintain circuit quality factor Q and reduce losses), this parasitic capacitance grows proportionally. Thus, arrays that have large values of capacitance and are able to adjust to higher total capacitance values are inherently limited in how low they can also adjust.

For illustration purposes, suppose the parasitic capacitance of each capacitor-switch combination is ¼ the value of the fixed capacitor of the capacitor-switch combination. One can gather that the parasitic capacitance of the first capacitor-switch combination would be ¹⁄₁₆ pF, the second capacitor-switch combination ⅛ pF, the third capacitor-switch combination ¼ pF, the fourth capacitor-switch combination ½ pF, and the fifth capacitor-switch combination 1 pF. When all switches are in the off state, the aggregate off capacitance is 1.9375 pF which can be approximated to 2 pF. The maximum capacitance of the array of five capacitors is 7.75 pF (¼+½+1+2+4) which can be approximated to 8 pF. Taking into consideration parasitic capacitance in the off state, and the total capacitance of all fixed capacitors when engaged, one can surmise that the binary array of FIG. 9 as a 4:1 tuning ratio. The parasitic capacitance of the largest corresponding switch ($S_5$) can add 1 pF which limits the minimum value of the array to 2 pF, thereby increasing the minimum capacitance value available to the circuit.

One aspect of a switched capacitor is that the circuit quality or Q of the switched capacitor includes the resistive losses in the MEMS or semiconductor switch which is in series with the capacitor. The Q of the resultant switched capacitor is the ratio of the reactance of the capacitor to the resistance of the combined switch and capacitor which we will define as $R_{total}$.

$$R_{total}=R_{sw}+R_{cap}$$

Where $R_{sw}$ is the resistance of the switch connected to a particular capacitor and $R_{cap}$ is the effective series resistance of the particular capacitor in the array. The reactance of the capacitor, $X_C$ is:

$$X_C = \frac{1}{\omega C},$$

where $\omega=2\pi f$ where f is the frequency of operation. Therefore, the Q of the switched capacitor is:

$$Q = \frac{X_c}{R_{total}} = \frac{1/\omega C}{R_{total}} = \frac{1}{\omega R_{total} C} = \frac{1}{2\pi f R_{total} C} = \frac{1}{2\pi f (R_{sw}+R_{cap})C}$$

A similar analysis can be done wherein the switched reactances are inductors instead of capacitors. In that case, the reactance of the inductor, $X_L$ is:

$$X_L=\omega L,$$

where $\omega=2\pi f$ where f is the frequency of operation. Therefore, the Q of the switched inductor is:

$$Q = \frac{X_L}{R_{total}} = \frac{\omega L}{R_{total}} = \frac{2\pi f L}{R_{total}} = \frac{2\pi f L}{(R_{sw}+R_{cap})}$$

Correspondingly, in order to maintain Q at a given frequency of operation, the resistance of the switch in the array must be inversely proportional to the size of the inductor in the array. Therefore, if an inductor in the array is one half the size of the next inductor in the array, the resistance of that switch must also be one half the resistance of the switch for the preceding inductor. As such, the smallest inductor in the array must have the largest switch (in order to reduce resistance and hence maintain Q) which is the opposite relationship of the switchable capacitor array. However, although the relationship is reversed by virtue of the nature of the reactance of the switched component, it is understood that all of the characteristics and attributes being described herein can be applied to either capacitors or inductors with this simple modification. What follows are illustrative embodiments of tunable switched capacitor arrays. However, a tunable switched inductor array is also contemplated by the present disclosure.

Typically, for size and cost reasons the fixed capacitors in the array will be situated within the semiconductor die and will be built using typical semiconductor capacitor fabrication methods such as metal-insulator-metal (MIM) or other known technologies. These semiconductor capacitor technologies are typically limited in the Q values they are capable of achieving, and as seen in the expressions above, the Q of these fixed capacitors has a significant impact on the total Q of the tunable capacitor array, and as such force the designer to size the switches large enough to compensate for the limited Q of the fixed capacitors. This limitation has the most impact on the die size of the switch connected to the largest value capacitor in the array.

Replacing this largest value capacitor with an external fixed capacitor would allow the designer to utilize a capacitor with a Q perhaps twice the Q available from semiconductor capacitors, and by doing so would allow the designer to reduce the size of the largest switch in the array significantly—see FIG. 11. For example, if the designer needed to maintain a Q factor for the switched capacitor of 60, by using an external capacitor with a Q of 250 instead of an internal semiconductor capacitor with a Q of 150 the designer would be able to increase the resistance of the switch on that capacitor by over 25%, which would allow the die area of that particular switch to be about 20% smaller. Since the switch for the largest capacitor in the binary array usually accounts for about ½ of the total switch die area of the array, this area savings would amount to approximately 10% of the total array switch area.

As was stated previously, in a typical switched capacitor binary array, the individual capacitor values are selected such that each capacitor is twice the capacitance of the previous capacitor in the array, with the smallest capacitor being the size required for the minimum resolution of the tunable capacitor. One can see that as the value of C increases, in order to maintain a particular Q value the resistance of the switch connected to the capacitor has to be decreased inversely proportionally. From further examination of the expression for Q, it can also be seen that the Q of the switched capacitor is inversely proportional to the operating frequency, such that the minimum Q value is apparent at the highest operating frequency of the capacitor. In other words, the switch must be designed to have a resistance small enough to maintain the target Q value at the highest frequency of operation.

This characteristic has an aspect that can be taken advantage of when a tunable capacitor such as shown in FIGS. 7-11 is utilized in a matching network of a cellular handset that operates over a wide frequency range such as, for example, 850 MHz, 900 MHz, 1800 MHz and 1900 MHz frequency bands. For convenience we will refer to the 850 MHz and 900 MHz bands as the "low bands" as they are both below 1 GHz and the 1800 MHz and 1900 MHz bands as the "high bands" as they are both just below 2 GHz. Considering the above expression for the Q of a switched capacitor, it is evident that in order to maintain the same value of Q, the resistance of a switch would need to be approximately half as large for a capacitor of a given value operating in the high bands as it would be for the same capacitor operating in the low bands. To accomplish this on a MEMS or semiconductor switch die would correspondingly require twice the die area to create the switch for the capacitor to operate in the high band as it would to operate in the low band.

It is another characteristic typical of tunable matching networks that larger value capacitors are usually only required when operating in the low band, while smaller capacitors are typically utilized when operating in the high band. This is primarily due to the fact that the reactance is an inverse function of the operating frequency as seen above, and as frequency increases, large value capacitors become very low in reactance, and as such have little effect on tuning or matching at high band frequencies when they are placed in a circuit in a series configuration, and would have too large an effect on tuning or matching when placed in a circuit in a shunt configuration.

This characteristic can be exploited in one embodiment of the present disclosure whereby the largest capacitor in a switchable capacitor binary array could be switched by a semiconductor or MEMS switch that had a larger resistance than that which would be required to maintain the target Q value in the high band, but instead sized to only maintain the target Q value in the low band—see FIG. 9. Doing so would significantly reduce the die area of the switch associated with the large value capacitor, and correspondingly reduce the cost of the die. Given the approximate 2 to 1 relationship of the high band and low band frequencies, allowing the switch to be one half the size (twice the resistance) for the largest value capacitor would result in an approximate 25% savings in the die area required for the total switchable capacitor binary array, since the largest value capacitor in the binary array is approximately one half of the total capacitance in the array.

An embodiment of the present disclosure can be applied to tuning a single reactive circuit element such as an antenna or other resonant structure. In such cases, the tunable capacitor can operate in the circuit along with another reactive element such as an inductor, and in practice the circuit will be tuned in order to be resonant at the frequency of operation. By virtue of the tunable capacitance, such a circuit can be tuned over a range of frequencies.

As an example, the analysis below considers a resonant circuit containing an inductor of value L and capacitor of value C, for which the equation below describes the formula for the resonant frequency.

$$\omega_{res}=2\pi f_{res}=1/\sqrt{LC}$$

As the expression shows, the resonant frequency is inversely proportional to the square root of the value of the capacitor, and when the value of the tunable capacitor is adjusted to achieve resonance at the desired frequency of operation, the value of the tunable capacitor will then be inversely proportional to the square of the desired frequency of operation. Correspondingly, at higher frequencies of operation, the capacitor will be tuned to lower values. Since the Q of the switched capacitor is an inverse function of C as was seen above, one can deduce that for each higher individual capacitor in a binary weighted array, the resistance will not need to be reduced by the same factor as the capacitance was increased. Therefore, while in order to maintain uniform Q of a tunable capacitor the switch resistance is usually cut in half (and switch die area doubled) for each doubling in capacitor size, for applications in which it is known that operating frequency is inversely proportional to the square root of the capacitance value the switch resistance can be made larger for larger capacitors in the array, thereby saving additional die area and cost.

As was shown above:

$$Q = \frac{1}{2\pi f R_{total} C}$$

Substituting for f to obtain an expression for $Q_{res}$ at $f_{res}$:

$$Q_{res} = \frac{1}{2\pi f_{res} RC} = \frac{1}{2\pi RC/2\pi\sqrt{LC}} = \frac{\sqrt{L}}{R\sqrt{C}}$$

Solving for R at $f_{res}$:

$$R = \frac{\sqrt{L}}{Q\sqrt{C}}$$

And, if Q is maintained as $f_{res}$ is tuned to the frequency of operation:

$$R \propto \frac{1}{\sqrt{C}}$$

Therefore, in order to maintain circuit Q in such an application, the total resistance for a capacitor in the array which is two times the size of another capacitor in the array need only have the resistance reduced by a factor of 1.414 (or to 71% instead of 50%). Correspondingly, in an exemplary application, for the largest capacitor in a binary array, the size of the switch may be only 1.414 times the size of the switch for the next largest capacitor in the array instead of normally being twice the size (in an application where Q is maintained uniformly across all capacitor values at a given frequency). Utilizing an array with non-uniform Q can result in a 29% reduction in the size of this switch, and by applying this principal to the entire binary array, a reduction of approximately the same percentage of the total switch area can be accomplished.

While this analysis is representative for a tuned circuit that includes a simple resonant inductor-capacitor circuit, for other circuits the resonance may not follow the exact $f_{res}=1/2\pi\sqrt{LC}$ relationship. However, in general, the circuit will typically require larger capacitance values at lower frequencies of operation, and once the exact relationship is determined, the appropriate scaling factor for the switch resistances required to achieve the required Q values can be determined and applied to the switched capacitor array.

A further extension of the above embodiment is to build the switched capacitor array in a non-binary fashion. That is, to not have each capacitor (except the smallest capacitors) in the array be one-half the capacitance of another capacitor in the array, but to rather have an array which splits the tunable capacitor into different non-binary-weighted capacitors. For example, an array of ¼ pF, ½ pF, 1 pF, 1 pF, 1 pF, can have the same tuning range as the binary weighted switched capacitor array ¼ pF, ½ pF, 1 pF, 2 pF, and can also have the same minimum resolution of ¼ pF (see FIG. 21, TABLE 1 and FIG. 22, TABLE 2). However, by further exploiting the characteristic explained above and allowing the Q of each individual capacitor and switch combination to vary, further reduction in total switch die size can be accomplished, and correspondingly, further reduction in die cost can be achieved. Since in some applications as described above, as the operating frequency is increased the tunable capacitor will typically be set to lower values of capacitance, each switch connected to the array of 1 pF capacitors (in this example) can be made of different size such that the total Q is maintained in the application. By allowing each 1 pF capacitor to individually be paired with a smaller switch, and activating them in a particular order, the Q of the total capacitance being switched into the tunable circuit can be maintained up to the frequency of operation.

In another embodiment this disadvantage can be overcome by allowing the largest value capacitor in the array (in the present illustration, the 4 pF capacitor) to be connected separately from the array by way of a port in the substrate as shown in FIGS. 10-11. In this way, if the design of the tunable capacitor requires a smaller total capacitance, the largest value in the array can be left unattached from the array, thereby allowing the tunable capacitor array to achieve smaller values of capacitance than if the largest capacitor was included in the circuit. In this embodiment, a circuit designer can choose between connecting the four smallest capacitors ($C_1$-$C_4$) which could give a tuning range of 1 pF (the approximate off capacitance of S1-S4, i.e., ¹⁄₁₆+⅛+¼+½) to 4 pF (4:1 tuning), or connecting all five capacitors which can give a tuning range of 2 pF to 8 pF (4:1 tuning) as described earlier. Both choices are available on the same die. If the largest capacitor in the array were not separated from the array as shown in FIGS. 10 and 11, a designer would be limited by a minimum value of 2 pF when the array is in the "off" state—assuming the switch size of the largest capacitor followed a binary array.

Figure 12:
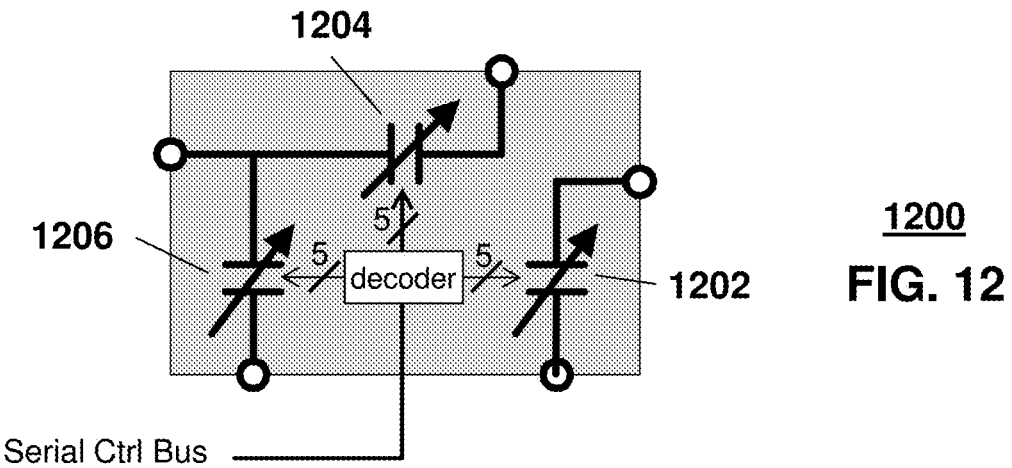
FIG. 12 depicts an illustrative embodiment for integrating any of the improved switched variable capacitor array of FIGS. 9-11 in a single Integrated Circuit (IC) or semiconductor die device.

One embodiment of the present disclosure can entail a single die such as shown in FIG. 12 that includes multiple tunable capacitors that can be placed onto circuit substrates which allow the tunable capacitors on the die to be connected into several different tunable matching network topologies which can be completely defined by the connecting metal patterns on the circuit substrates. It should be noted that the tuning range of each of the tunable capacitors can be controlled by a serial bus which feeds an independent decoder integrated with each tunable capacitor. These substrates can be multi-layer printed circuit boards, or multi-layer ceramic substrates and allow the die to connect to other electronic components such as fixed value capacitors and inductors which together embody the tunable matching network. Such substrates are typically very inexpensive, and as such multiple versions, embodying multiple schematic topologies can be kept in stock by a tunable matching network manufacturer, thus allowing the flexibility of quickly converting many different tunable matching network designs to production once the final design is determined.

One embodiment of the present disclosure can entail the inclusion of fixed value capacitors on the substrates which would connect in parallel with the tunable capacitors on the die to provide additional capacitor value range for the tunable matching network design. For instance, the tunable capacitor on the die may have the range of values from 1 picofarads to 5 picofarads, but by adding a fixed 2 picofarad capacitor in parallel, the effective range of the capacitor could be extended to 3 picofarads to 7 picofarads. This would reduce the tuning ratio from 5:1 to 7:3, but by extending the value provides flexibility which may be required to accomplish the matching impedances required for a specific application without changing the die which embodies the tunable capacitors.

Figure 13:
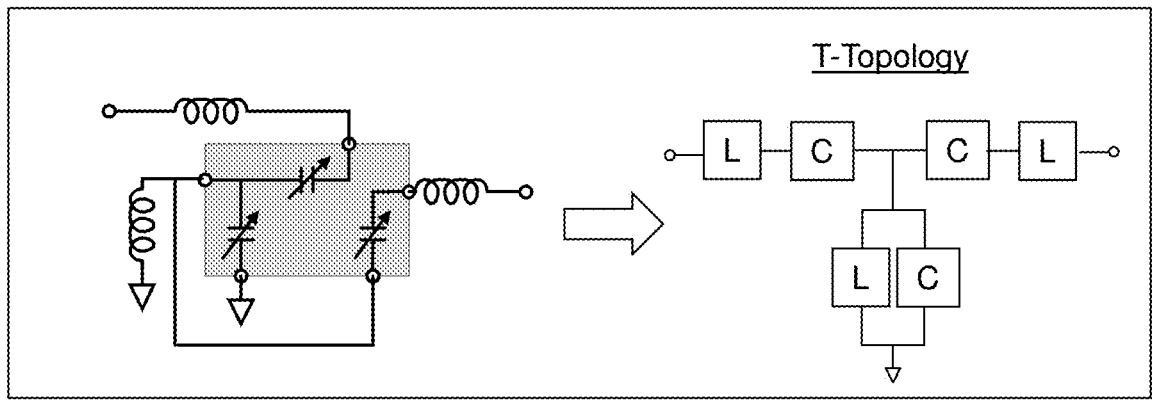
FIGS. 13-17 depict illustrative embodiments of topologies applied to the IC device of FIG. 12.
Figure 14:
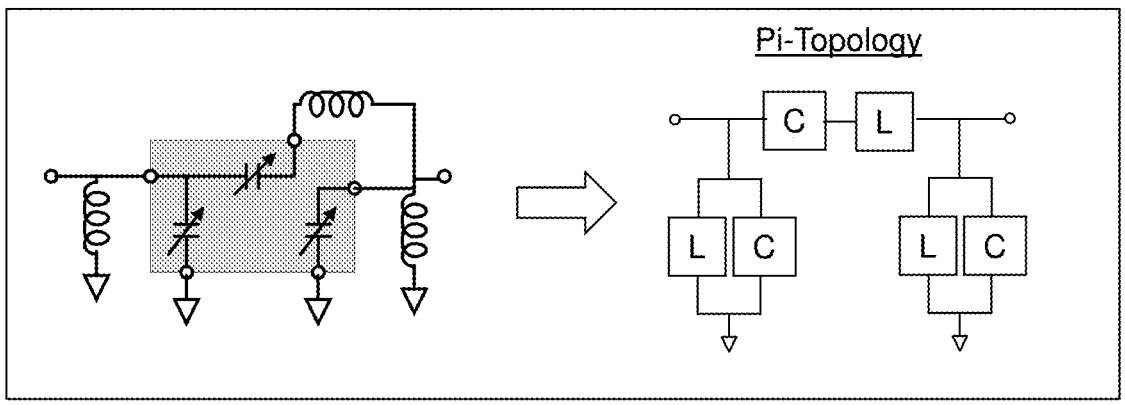
Figure 15:
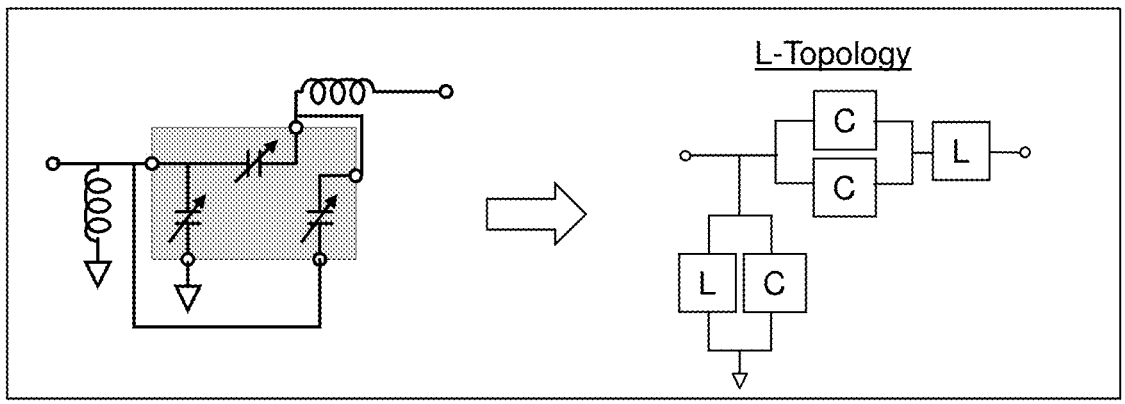
Figure 16:
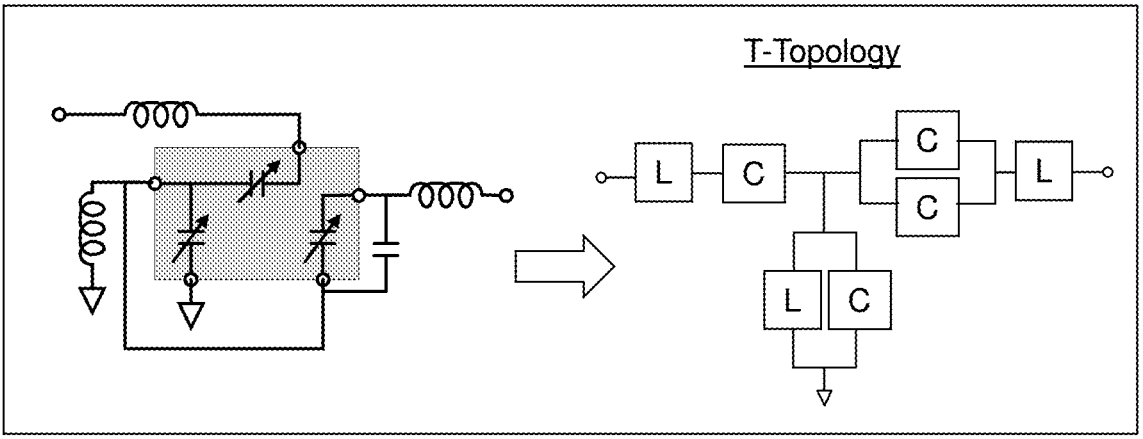
Figure 17:
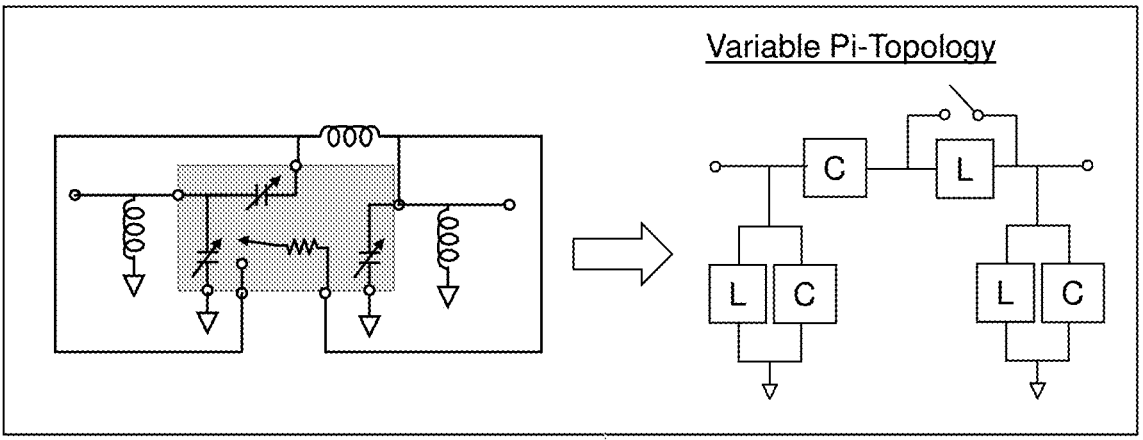

FIG. 12 depicts a block diagram of a single die that could contain 3 tunable capacitors connected in a manner that would allow the die to be connected in either a "Tee" configuration as shown in FIGS. 13 and 16, or a "Pi" configuration as shown in FIGS. 14 and 17, or an "L" configuration as shown in FIG. 15. It should be noted that tunable capacitor 1202 of FIG. 12 could be connected in parallel or in series with either of the other tunable capacitors on the die to create a tunable capacitor with either a larger total value or smaller (respectively) while still maintaining tuning ratio of the combined capacitance. Also note that a myriad of circuit topologies could be created with the three tunable capacitors on the die, and the module substrate is all that needs to change for this single die to support all these possible topologies. For example, an external fixed capacitor can be connected in parallel to one of the tunable capacitors on the die of FIG. 16 to increase the effective value of the tunable capacitor in parallel with said fixed capacitor.

Modern wireless systems need to support multiple modes and bands of operation. There can be multiple ways to architect a radio system to support such systems. In certain cases, antenna or other tunable matching networks may be deployed in separate circuit paths. One specific example would be to separate the circuit paths by frequency range, such as low band and high band ranges. Another example would be to separate the circuit paths transmit and receive. The illustrations in FIGS. 18-20 are specific to a high band—low band separation—additional embodiments are contemplated.

Figure 18:
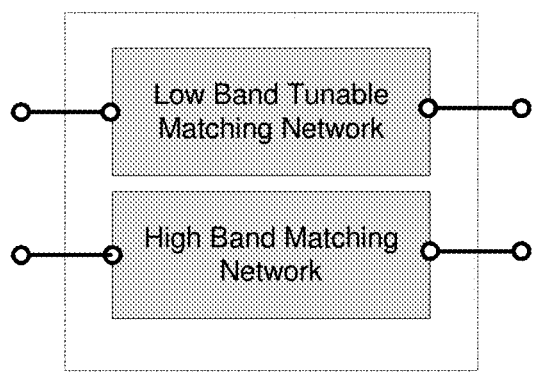
FIGS. 18-20 depict illustrative embodiments of low band and high band matching networks.
Figure 19:
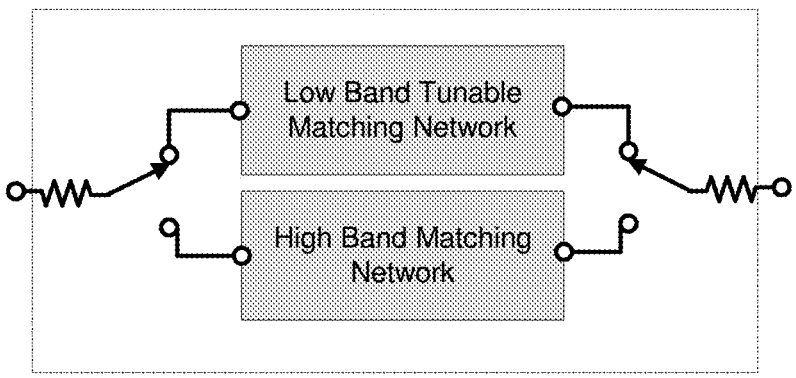

FIG. 18 depicts low band and high band independent matching networks on a single die. FIG. 19 depicts an embodiment in which signal switches are integrated into the tunable matching network die to allow the matching network to be divided into two separate paths. One or both paths can include tunable matching networks. One of the switches on one side of the matching networks of FIG. 19 could be eliminated while the switch on the other port is retained, which would allow such a tuner to be placed in front of a single input switchplexer (radio) but connected to a dual feed antenna, or two separate antennas. Alternatively, the switch on one side of the matching networks of FIG. 19 could be eliminated while the switch on the other port is retained, which would allow such a tuner to be placed in front of a single input antenna but connected to a dual input switchplexer (radio).

Figure 20:
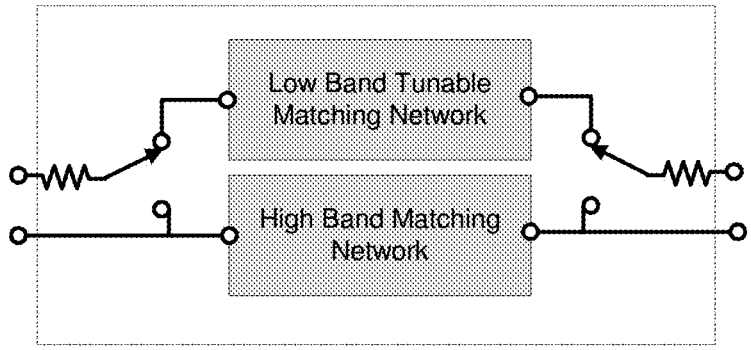

FIG. 20 depicts an embodiment that introduces additional flexibility to the integrated circuit die which embodies this circuit by allowing it to be used in both single path architectures and dual path architectures. It should be considered that a switch in FIG. 20 could be eliminated by fixing it in one position, allowing the tunable matching network to interface to a handset front end switchplexer that was configured to have two inputs rather than just a single antenna input. It should also be considered that a switch in FIG. 20 could be eliminated by fixing it in one position, allowing the tunable matching network to interface to a handset antenna that was configured to have two inputs rather than just a single antenna input.

In sum, one embodiment of the present disclosure can entail the inclusion of additional switches on the semiconductor or MEMS die of a matching network with the function of separating the signal paths within the tunable matching network. Such an approach can allow the designer to provide for separate tunable matching networks for either the low band or high band by switching the signal path at the input and outputs of two separate tunable matching networks, diverting the signal to one or the other depending upon the frequency of operation, or any other attribute by which the two paths could be distinguished. In some instances, one of the paths could consist of a simple "through" connecting the input to the output, or a fixed matching network thereby providing a tunable matching network in one band and a fixed matching network in the other band.

Referring to FIG. 17, one embodiment of the present disclosure can entail the inclusion of additional switches on the semiconductor or MEMS die of a matching network with the function of bypassing certain sections of the tunable impedance match. Certain tunable matching networks may include sections that could include for instance a series tunable capacitor and series inductor which may provide significant impedance tuning in the low band, but introduce a high impedance in the high band and as such introduce significant insertion loss in the high band. Bypassing, or shunting around these two parts could allow the tunable matching network to have much lower loss in the high band by effectively removing those components when they are not required. Other such circuit elements or sections of circuitry could be bypassed for similar reasons in either the low band or high band, or in some cases when matching particular impedances which do not require the specific elements being bypassed. This is an example of such an application but is not intended to limit the applications of such a shunt/bypass switch for use in tunable matching networks.

Generally speaking, to maximize the performance of a tunable matching network, and also to reduce the total cost, a typical tunable matching network should be designed uniquely for a specific application, and to do so would require a unique tunable capacitor die to be designed for each application. Experience shows that in the case where the application is a tunable matching network for a cellular handset antenna, this would require significant delays in the production of such a handset, since the tunable capacitor die would not be defined until after the handset antenna design was completed which is typically toward the end of the handset design cycle. Correspondingly, it would be very difficult for a handset designer to meet what are usually very aggressive schedule targets and use a tunable matching network that required a unique tunable capacitor die due to the issues described above. The various embodiments described in the present disclosure and others contemplated by the scope of the claims below clearly overcome the disadvantages of present systems.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A device comprising:
    a tunable matching network on a single die, the tunable matching network including a plurality of signal switches,
    wherein the plurality of signal switches are configurable to provide a first matching network and a separate second matching network having respectively a low-frequency signal path and a high-frequency signal path,
    wherein the single die has a plurality of ports for coupling to an input and an output of the first matching network and to an input and an output of the second matching network;
    wherein one or both of the low-frequency signal path and the high-frequency signal path comprises a tunable network; and
    wherein an input switch of the plurality of signal switches is directly coupled to an input port of the plurality of ports and an output switch of the plurality of signal switches is directly coupled to an output port of the plurality of ports.

2. The device of claim 1, wherein at least a portion of the plurality of signal switches are integrated into the die.

3. The device of claim 1,
    wherein one or both of the low-frequency signal path and the high-frequency signal path comprises a tunable network; wherein a first input port of the plurality of ports and a separate second input port of the plurality of ports are respectively coupled to the input of the first matching network and the input of the second matching network, and
    wherein the output switch of the plurality of signal switches is configured to connect the output port alternately to the output of the first matching network or the output of the second matching network.

4. The device of claim 3, wherein the first input port and the second input port are connected to a dual-mode antenna.

5. The device of claim 1, wherein the device comprises a radio system, and wherein the tunable matching network is configured to connect to one of a single-input radio or a dual-input radio.

6. The device of claim 1, wherein the device comprises a handset, and wherein the tunable matching network is configured to interface to an antenna of the handset.

7. The device of claim 1,
    wherein a first output port of the plurality of ports and a separate second output port of the plurality of ports are respectively coupled to the output of the first matching network and the output of the second matching network, and
    wherein the input switch of the plurality of signal switches is configured to connect the input port alternately to the input of the first matching network or the input of the second matching network.

8. The device of claim 7, wherein the input switch is configured to divert a signal to one of the low-frequency signal path or the high-frequency signal path, in accordance with a frequency of the signal.

9. The device of claim 1, wherein the device is configured to provide a tunable matching network in one of a low-frequency signal band and a high-frequency signal band and a fixed matching network in the other of the low-frequency signal band and the high-frequency signal band.

10. A device comprising:
    a tunable matching network on a single die, the tunable matching network including a plurality of signal switches,
    wherein the plurality of signal switches are configurable to provide a first tunable matching network and a separate second tunable matching network having respectively a low-frequency signal path and a high-frequency signal path, and to divert a signal to one of the low-frequency signal path or the high-frequency signal path, in accordance with a frequency of the signal; and
    wherein an input switch of the plurality of signal switches is directly coupled to an input port of the plurality of ports and an output switch of the plurality of signal switches is directly coupled to an output port of the plurality of ports.

11. The device of claim 10, wherein at least a portion of the plurality of signal switches are integrated into the die.

12. The device of claim 10, wherein the single die has a plurality of ports for coupling to an input and an output of the first tunable matching network and to an input and an output of the second tunable matching network.

13. The device of claim 12,
    wherein a first input port of the plurality of ports and a separate second input port of the plurality of ports are respectively coupled to the input of the first tunable matching network and the input of the second tunable matching network, and
    wherein the output switch of the plurality of signal switches is configured to connect the output port alternately to the output of the first tunable matching network or the output of the second tunable matching network.

14. The device of claim 13, wherein the first input port and the second input port are connected to a dual-mode antenna.

15. The device of claim 12,
    wherein a first output port of the plurality of ports and a separate second output port of the plurality of ports are respectively coupled to the output of the first tunable matching network and the output of the second tunable matching network, and
    wherein the input switch of the plurality of signal switches is configured to connect the input port alternately to the input of the first tunable matching network or the input of the second tunable matching network.

16. A device comprising:
    a tunable matching network on a single die, the tunable matching network including a plurality of signal switches,
    wherein the plurality of signal switches are configurable to provide in the tunable matching network a first signal path and a separate second signal path, the first signal path and the second signal path respectively comprising a low-frequency signal path and a high-frequency signal path, wherein the single die has a plurality of ports for coupling to an input and an output of the first signal path and to an input and an output of the second signal path;

wherein the plurality of signal switches are configured to divert a signal to one of the low-frequency signal path or the high-frequency signal path, in accordance with a frequency of the signal; and wherein an input switch of the plurality of signal switches is directly coupled to an input port of the plurality of ports and an output switch of the plurality of signal switches is directly coupled to an output port of the plurality of ports.

17. The device of claim 16, wherein at least a portion of the plurality of signal switches are integrated into the die.

18. The device of claim 16, wherein a first input port of the plurality of ports and a separate second input port of the plurality of ports are respectively coupled to the input of the first signal path and the input of the second signal path, and wherein the output switch of the plurality of signal switches is configured to connect the output port alternately to the output of the first signal path or the output of the second signal path.

19. The device of claim 18, wherein the first input port and the second input port are connected to a dual-mode antenna.

20. The device of claim 16, wherein a first output port of the plurality of ports and a separate second output port of the plurality of ports are respectively coupled to the output of the first signal path and the output of the second signal path, and wherein the input switch of the plurality of signal switches is configured to connect the input port alternately to the input of the first signal path or the input of the second signal path.

* * * * *